United States Patent
Gautron et al.

(10) Patent No.: US 9,235,663 B2
(45) Date of Patent: Jan. 12, 2016

(54) METHOD FOR COMPUTING THE QUANTITY OF LIGHT RECEIVED BY A PARTICIPATING MEDIA, AND CORRESPONDING DEVICE

(71) Applicant: THOMSON LICENSING, Issy de Moulineaux (FR)

(72) Inventors: Pascal Gautron, Rennes (FR); Cyril Delalandre, Montreuil le Gast (FR); Jean-Eudes Marvie, Betton (FR)

(73) Assignee: Thomson Licensing, Issy les Moulineaux (FR)

( * ) Notice: Subject to any disclaimer, the term of this patent is extended or adjusted under 35 U.S.C. 154(b) by 316 days.

(21) Appl. No.: 13/923,199

(22) Filed: Jun. 20, 2013

(65) Prior Publication Data
US 2013/0346041 A1   Dec. 26, 2013

(30) Foreign Application Priority Data
Jun. 22, 2012 (FR) .................................. 12 55940

(51) Int. Cl.
*G06F 17/50* (2006.01)
*G06T 15/50* (2011.01)

(52) U.S. Cl.
CPC .......... *G06F 17/5009* (2013.01); *G06T 15/506* (2013.01)

(58) Field of Classification Search
USPC .................................. 703/2, 5; 345/421, 422
See application file for complete search history.

(56) References Cited

U.S. PATENT DOCUMENTS

| | | | | |
|---|---|---|---|---|
| 3,996,673 | A * | 12/1976 | Vorst et al. | 345/16 |
| 4,737,921 | A * | 4/1988 | Goldwasser et al. | 345/421 |
| 5,649,078 | A * | 7/1997 | Gerth et al. | 345/422 |
| 6,891,538 | B1 * | 5/2005 | Tannenbaum | 345/426 |
| 2004/0004723 | A1 * | 1/2004 | Seko et al. | 356/498 |
| 2008/0068443 | A1 | 3/2008 | Thielman et al. | |

(Continued)

FOREIGN PATENT DOCUMENTS

FR    2948800    2/2011

OTHER PUBLICATIONS

Tokuyoshi_etal_fast rendering method for a scene with participating media of anisotropic scattering property_computer graphics international 2005 stony brook, NY, USA Jun. 22-24, 2005. Piscataway, NJ, USA, IEEE. Jun. 22, 2005, pp. 227-233.

(Continued)

*Primary Examiner* — Thai Phan
(74) *Attorney, Agent, or Firm* — Volpe and Koenig, P.C.

(57) ABSTRACT

A method for estimating the quantity of light received by a point M of a heterogeneous participating media, the light being emitted by a light environment. Thereafter, the method comprises estimating, for each point of a first set of points, first values representative of the light attenuation between the considered point and a first surface bounding the media along a plurality of particular directions of light emission, estimating first coefficients of projection by projection of the first values of reduction of light intensity in an orthonormal basis of spherical functions, estimating second values representative of the light attenuation between the point and a second surface along directions, the second surface comprising some of the points of the neighborhood of the point, and estimating the quantity of light received by the point using first coefficients of projection and second values of reduction of light intensity.

22 Claims, 6 Drawing Sheets

(56) References Cited

U.S. PATENT DOCUMENTS

Figure 1:
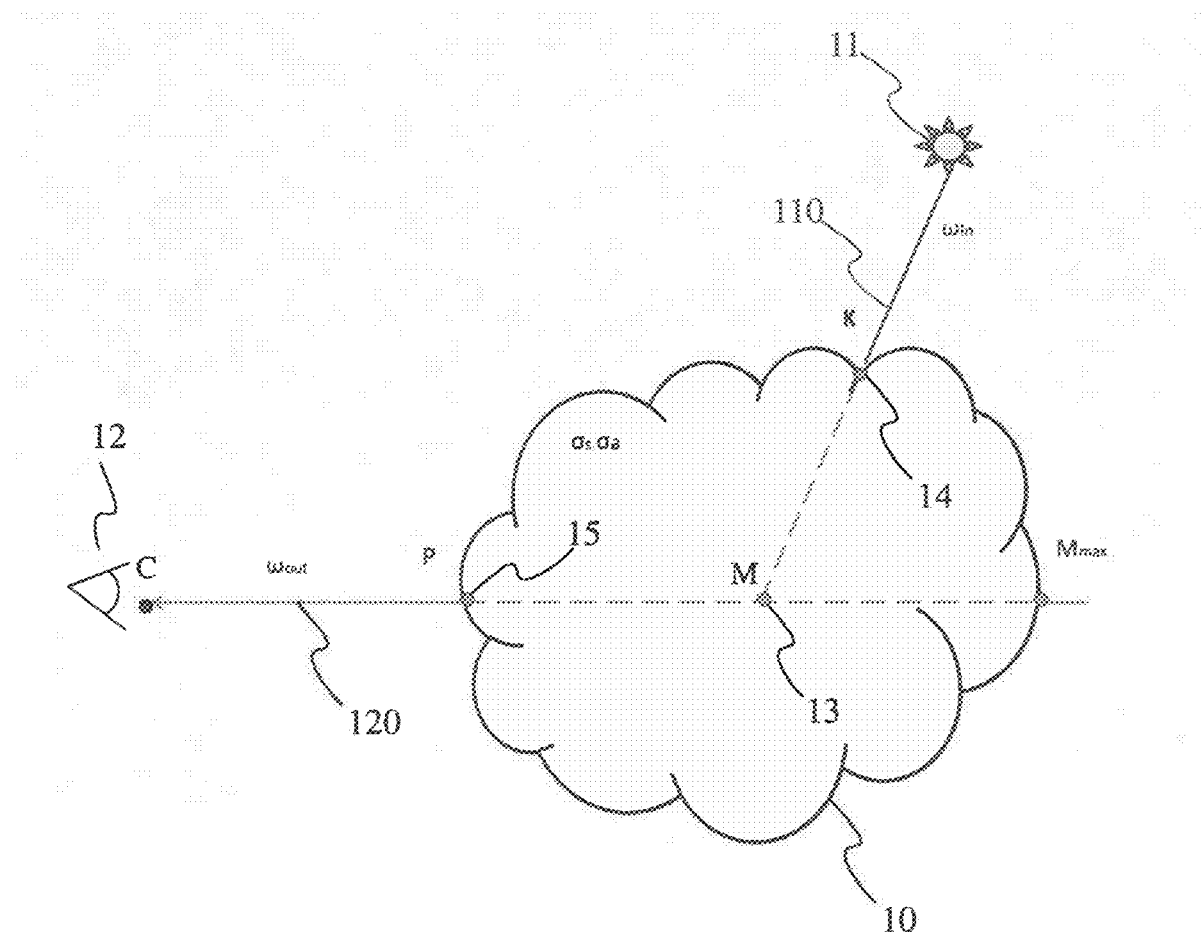

| | | | |
|---|---|---|---|
| 2009/0006044 A1* | 1/2009 | Zhou et al. | 703/2 |
| 2009/0006046 A1* | 1/2009 | Zhou et al. | 703/2 |
| 2009/0006052 A1* | 1/2009 | Zhou et al. | 703/5 |
| 2012/0218549 A1 | 8/2012 | Gautron et al. | |

OTHER PUBLICATIONS

Search Report Dated Feb. 27, 2013.
Bouthors et al., "Interactive multiple anisotropic scattering in clouds", ACM Proceedings of the 2008 symposium on Interactive 3D graphics and games, Feb. 15, 2008, Redwood City, California, USA, pp. 173-182.
Chandrasekhar, "Radiative Transfer" University of Chicago, New York, 1950, pp. 1-415.
Dachsbacher et al., "Translucent Shadow Maps", Eurographics Symposium on Rendering 2003, Jun. 25, 2003, Leuven, Belgium, pp. 1-6.
Francois et al., "Subsurface Texture Mapping", IEEE Computer Graphics and Applications, vol. 28, No. 1, Jan.-Feb. 2008, pp. 34-42.
Gautron et al., "Volumetric Shadow Mapping", SIGGRAPH 2009, New Orleans, Loisiana, USA, Aug. 3, 2009, pp. 1.
Mitchell, "8.1 Light Shaft Rendering", Shader X3 Advanced Rendering with DirectX and OpenGL, edited by Wolfgang Engel, Charles River Media, 2005, pp. 573-588.
Sloan, "Stupid Spherical Harmonics (SH) Tricks", Proceedings of Game Developers Conference, Feb. 14, 2008, pp. 1-42.

* cited by examiner

METHOD FOR COMPUTING THE QUANTITY OF LIGHT RECEIVED BY A PARTICIPATING MEDIA, AND CORRESPONDING DEVICE

This application claims the benefit, under 35 U.S.C. §119 of French Patent Application 1255940, filed Jun. 22, 2012.

1. SCOPE OF THE INVENTION

The invention relates to the domain of synthesis image composition and more specifically to the domain of light scattering (diffusion) simulation in a heterogeneous participating media. The invention also falls within the scope of special effects for a live composition.

2. PRIOR ART

According to the prior art, different methods exist for simulating the diffusion of light in participating media such as for example fog, smoke, dust or clouds. The participating media correspond to media composed of airborne particles which interact with the light to modify its path and intensity in particular.

The participating media can be broken down into two parts, i.e. homogeneous media, such as water and heterogeneous media, such as smoke or clouds. In the case of homogeneous participating media, it is possible to calculate, in an analytical manner, the attenuation of the light transmitted by a light source. In fact, due to their homogeneous nature, these media have parameters such as the light absorption coefficient or the light diffusion coefficient constant at any point of the media. Conversely, the light absorption and scattering (diffusion) properties vary from one point to another in a heterogeneous participating media. The calculations required to simulate the diffusion of light in such a heterogeneous media are then very costly and it is thus not possible to calculate analytically and live the quantity of light scattered (diffused) by a heterogeneous participating media. In addition, the media not being diffused (that is to say the diffusion of the media being anisotropic), the quantity of light diffused by the media also varies according to the diffusion direction of the light, that is to say the direction in which a person views the media. Calculations estimating the quantity of light diffused must then be reiterated for each direction of observation of the media by a person in order to obtain a realistic rendering of the media.

To produce the live display of heterogeneous participating media, some methods perform the pre-calculation of some parameters representative of the heterogeneous participating media. Though these methods are perfectly adapted for a studio use in post-production for example and provide a good quality display, these methods are not adapted in the context of live interactive conception and composition of a heterogeneous participating media. Such a method is for example described in patent application WO2009/003143 filed by Microsoft Corporation and published on 31 Dec. 2008. The purpose of the invention subject of the WO2009/003143 application is a live software for the rendering of a heterogeneous medium and describes a solution using radial basic functions. This solution cannot however be considered as a live rendering solution since some pre-processing operations must be applied off line to the participating medium to be able to compute coefficients of projection representing the medium which will be used for picture synthesis live computations.

With the emergence of interactive simulation games and applications, notably in three dimensions (3D), the need is being felt for live simulation methods offering a realistic display of heterogeneous participating media.

3. SUMMARY OF THE INVENTION

The purpose of the invention is to overcome at least one of these disadvantages of the prior art.

More specifically, the purpose of the invention is to optimise the required calculation time and/or calculation power required to compose a realistic live display of the diffusion of light in a heterogeneous participating media.

The invention relates to a method for estimating the quantity of light received by a point M of a heterogeneous participating medium (10), the light being transmitted by a light environment comprising a plurality of light sources. The method comprises the steps for:

selecting some of the points of the media to form a first set of points of the media, the first set consisting of the point M:

for each point in the first set, estimating a plurality of first values of reduction of light intensity representative of the light attenuation between the point considered and a first surface along a plurality of particular directions of light emission, the first surface bounding the medium, estimating a plurality of second values of reduction of light intensity representative of the light attenuation between the point M and a second surface along the plurality of specific directions of light emission, the second surface comprising some of the points of the neighborhood of the point M belonging to the first set, for each point of the first set, estimating first coefficients of projection representative of the reduction of light intensity at the point considered by projection of the first values of reduction of light intensity in an orthonormal basis of spherical functions, and estimating the quantity of light received by the point M using estimated first coefficients of projection and the plurality of second values of reduction of light intensity.

According to a specific characteristic, the method comprises a step for estimating the quantity of light received by each of the points in the first set belonging to the second surface using estimated first coefficients of projection for the points of the second surface.

Advantageously, the method comprises a step for estimating points of intersection between the second surface and the plurality of particular directions of light emission, the quantity of light received by an intersection point being estimated by interpolation of the quantity of light received by at least two points of the second surface belonging to the first set of points when the intersection point does not belong to the first set of points.

According to a specific characteristic, the method comprises a step for estimating second coefficients of projection representative of the reduction of light intensity at the point M by projection of second values of reduction of light intensity in said orthonormal basis of spherical functions, the quantity of light received by the point M being estimated using the estimated first coefficients of projection and the estimated second coefficients of projection.

Advantageously, the estimation of the first and second values of reduction of light intensity is carried out via sampling of the particular directions of light emission.

According to a specific characteristic, the method comprises a step for estimating third coefficients of projection in an orthonormal basis of spherical functions, the third coefficients of projection being representative of the incident luminance for a set of points of the light environment.

According to another characteristic, the method comprises a step for estimating fourth coefficients of projection in the orthonormal basis of spherical functions, the fourth coefficients of projection being representative of the phase function for a second set of points of the media.

Advantageously, the method comprises a step for estimating the quantity of light diffused by the point M from the quantity of light received by the point M.

According to a particular characteristic, the estimation of the quantity of light diffused by the point M is carried out using the ray-marching algorithm method.

According to another characteristic, the first coefficients of projection and the second coefficients of projection are stored in a table of a memory associated with at least one graphics processor.

The invention also relates to a device configured for estimating the quantity of light received by a point M of a heterogeneous participating media (10), the light being emitted by a light environment comprising a plurality of light sources, the device comprising:
- means for selecting some points from the media to form a first set of points of the media, the first set comprising said point M,
- means for estimating, for each point in the first set, a plurality of first values of reduction of light intensity representative of the light attenuation between the point considered and a first surface along a plurality of particular directions of light emission, the first surface bounding the medium,
- means for estimating a plurality of second values of reduction of light intensity representative of the light attenuation between the point M and a second surface along the plurality of specific directions of light emission, the second surface comprising some of the neighbouring points of the point M belonging to the first set,
- means for estimating, for each point of the first set, first coefficients of projection representative of the reduction of light intensity at the point considered by projection of the first values of reduction of light intensity in an orthonormal basis of spherical functions, and
- means for estimating the quantity of light received by the point M using the estimated first coefficients of projection and the plurality of second values of reduction of light intensity.

According to a specific characteristic, the device comprises means for estimating second coefficients of projection representative of the reduction of light intensity at the point M by projection of second values of reduction of light intensity in the orthonormal basis of spherical functions, the quantity of light received by the point M being estimated using the estimated first coefficients of projection and the estimated second coefficients of projection.

Advantageously, the device comprises means for estimating third coefficients of projection in the orthonormal basis of spherical functions, the third coefficients of projection being representative of the incident luminance for a set of points of the light environment.

According to a particular characteristic, the device comprises means for estimating fourth coefficients of projection in the orthonormal basis of spherical functions, the fourth coefficients of projection being representative of the phase function for a second set of points of the media.

The invention also relates to a computer program product comprising program code instructions for the execution of the steps of the method for estimating the quantity of light received by a point M of a heterogeneous participating media when the program is executed on a computer.

The invention also relates to a computer readable storage means, storing the set of computer executable instructions to implement the method for estimating the quantity of light received by a point M of a heterogeneous participating media.

4. LIST OF FIGURES

The invention will be better understood, and other specific features and advantages will emerge upon reading the following description, the description making reference to the annexed drawings wherein:

FIG. 1 diagrammatically illustrates a heterogeneous participating media diffusing light, according to a particular embodiment of the invention.

Figure 2A:
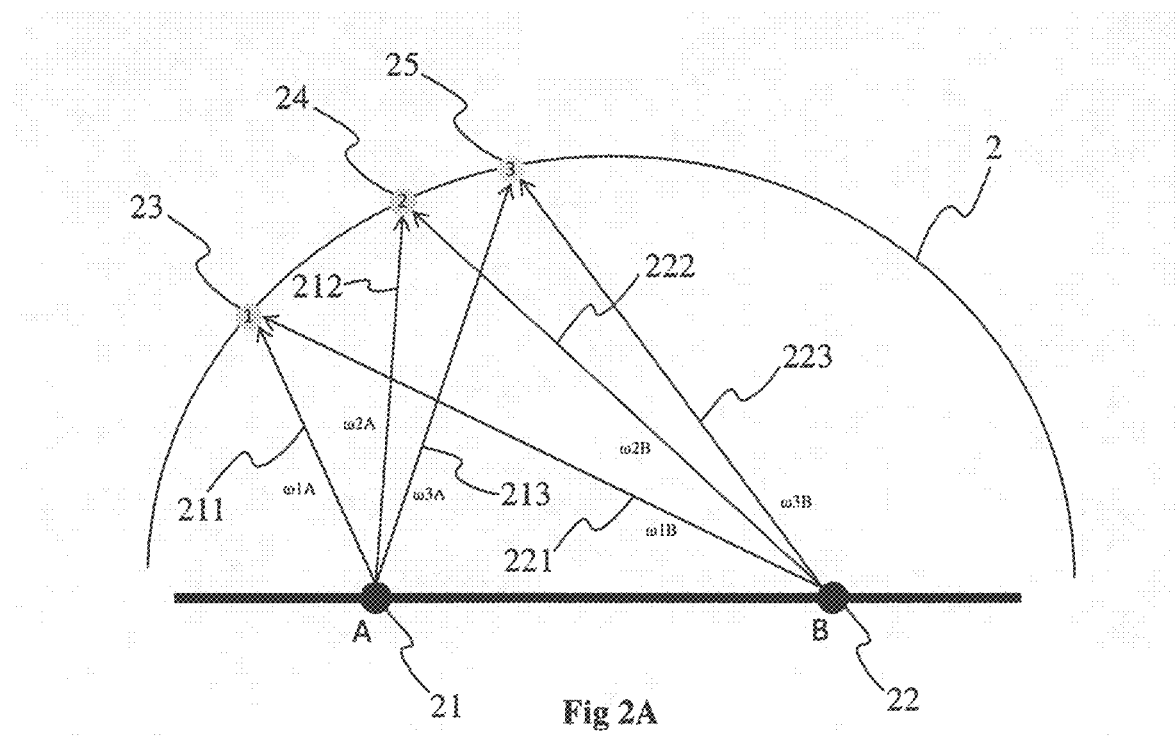
Figure 2B:
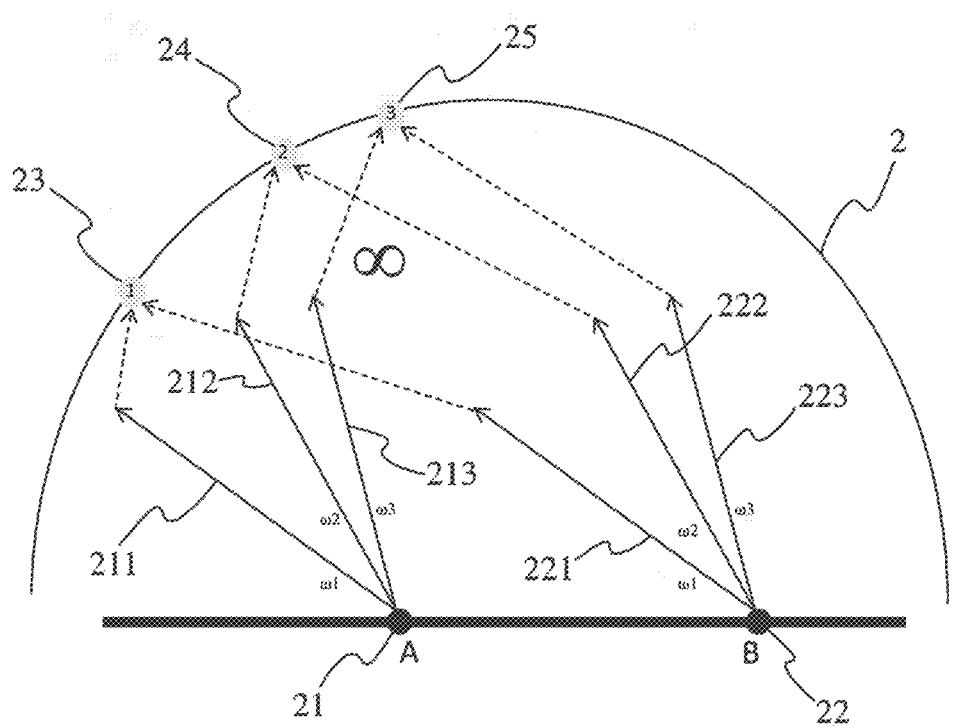

FIGS. 2A and 2B illustrate a light environment comprising several light sources, according to a particular embodiment of the invention.

Figure 3:
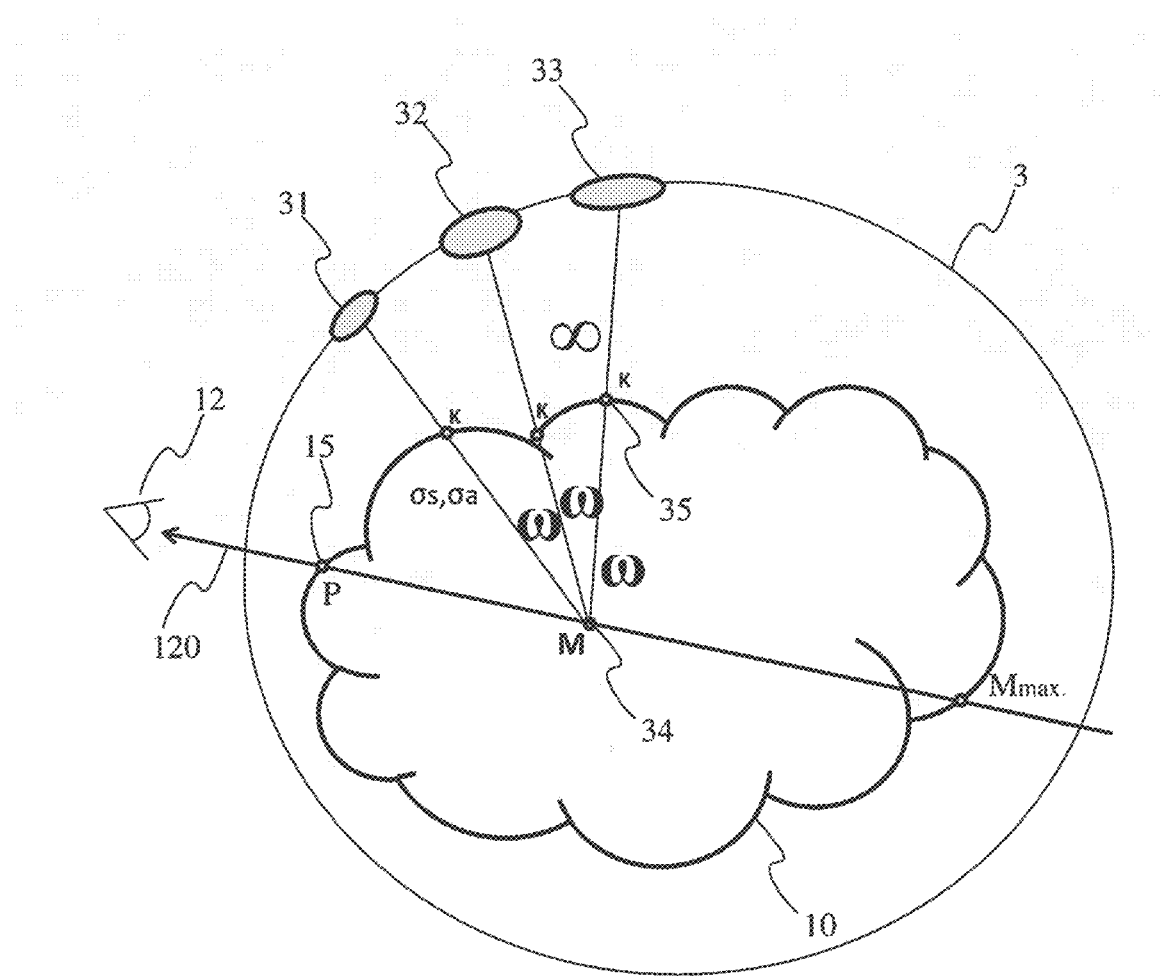
Figure 4:
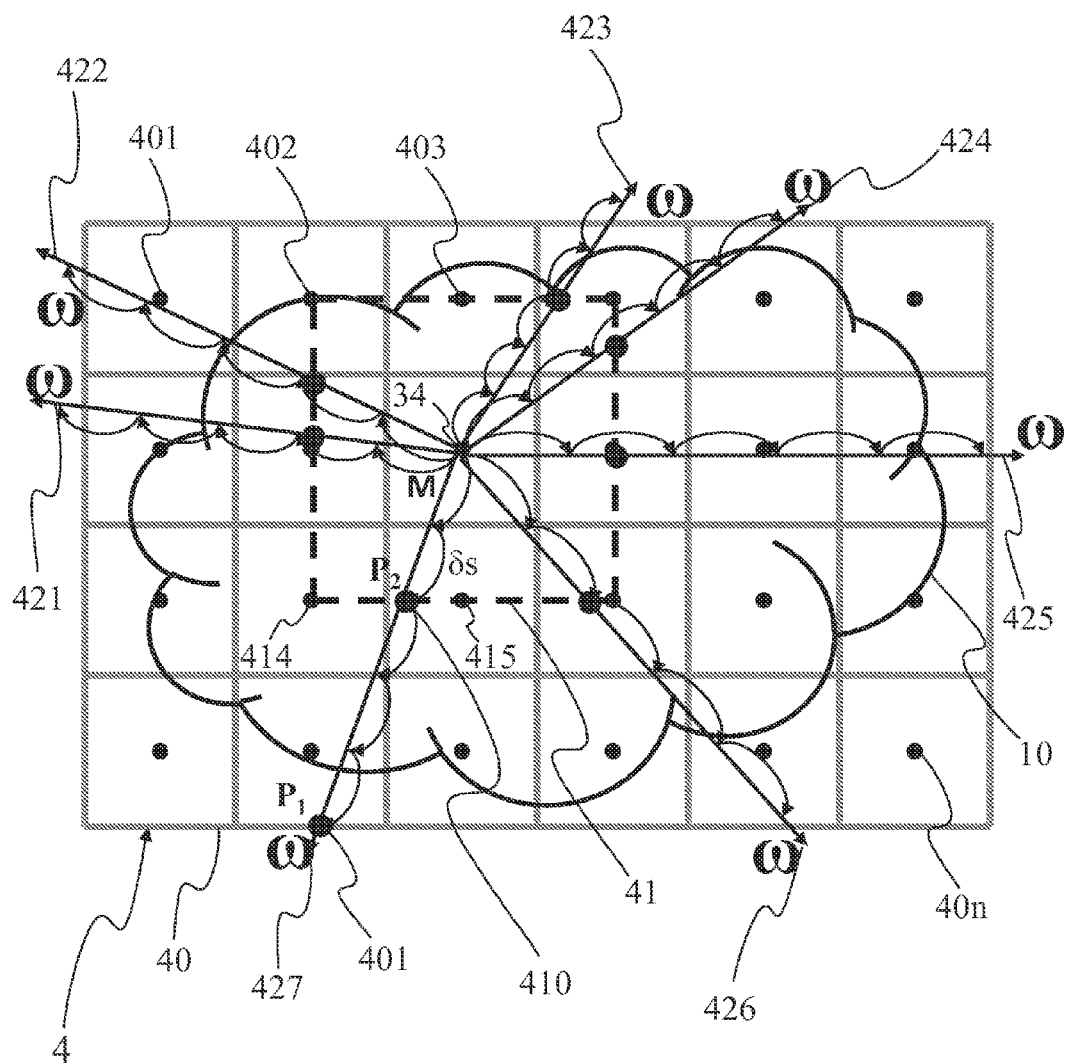
Figure 5:
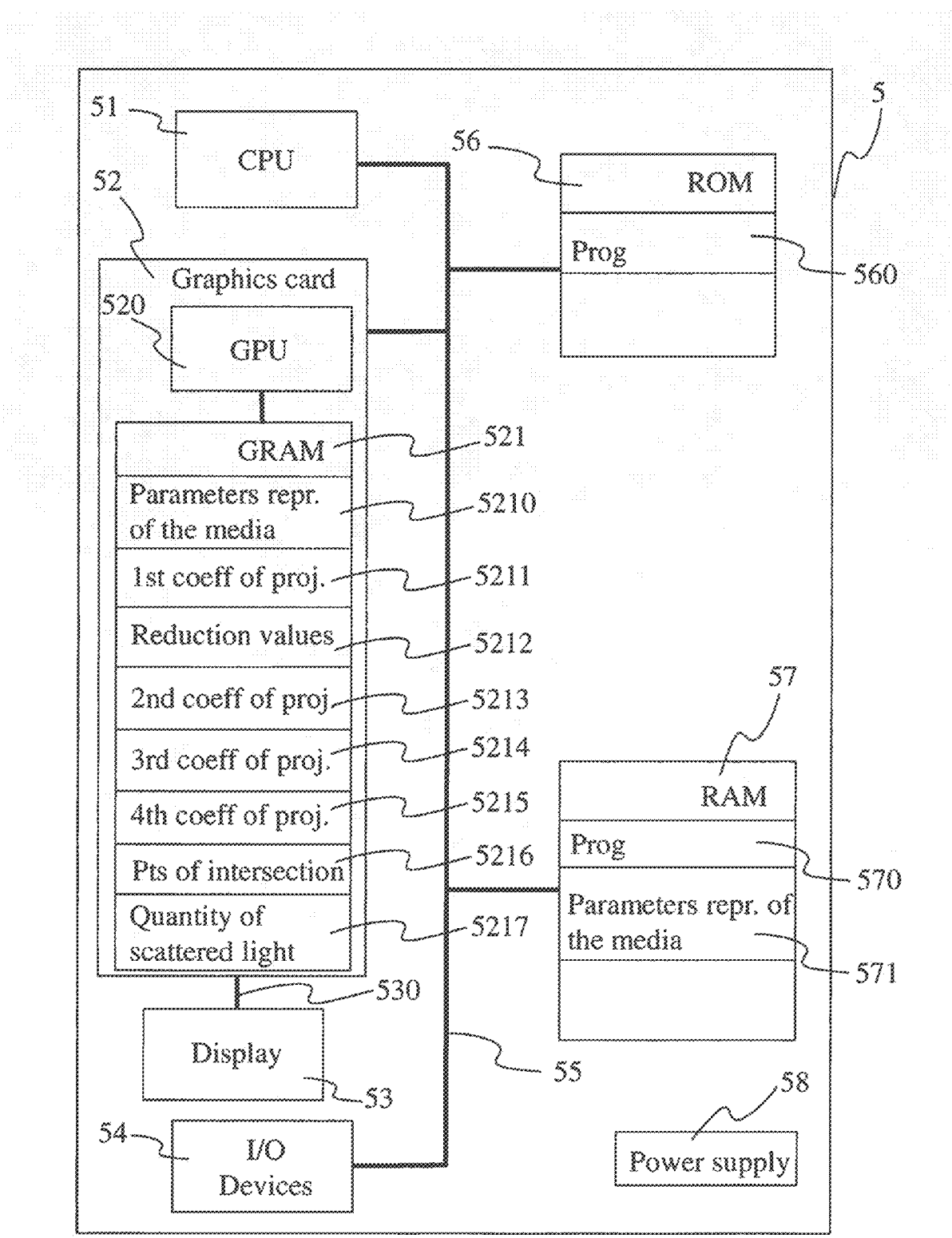
Figure 6:
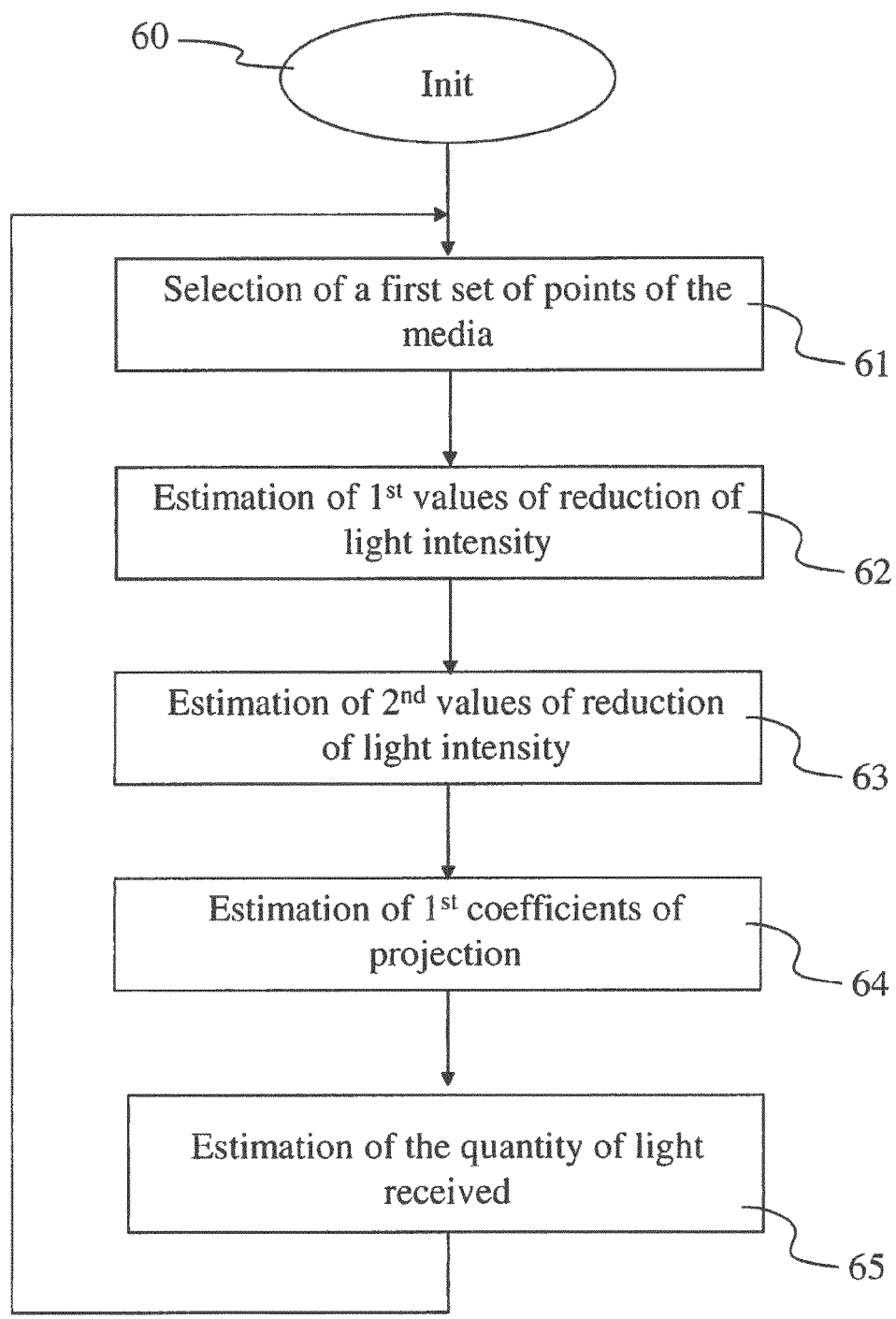

FIG. 3 diagrammatically illustrates a method for estimating the quantity of light received and diffused by a media of FIG. 1 lit by a light environment of FIGS. 2A and 2B, according to a particular embodiment of the invention, FIG. 4 diagrammatically illustrates a method for estimating coefficients of projection at each point of a set of points of the media of FIG. 1, according to a particular embodiment of the invention, FIG. 5 illustrates a device implementing a method for estimating the quantity of light received, according to a particular implementation embodiment of the invention, FIG. 6 illustrates a method for estimating the quantity of light received at a point of a media of FIG. 1 implemented in the device of FIG. 5, according to a particular embodiment of the invention.

5. DETAILED DESCRIPTION OF EMBODIMENTS OF THE INVENTION

FIG. 1 shows a heterogeneous participating media 10, for example a cloud, fog or smoke. A participating media is a media, composed of a multitude of particles in suspension, that absorbs, emits and/or diffuses light. In its simplest form, a participating media only absorbs light, for example light received from a light source 11 such as the sun for example. This means that light passing through the media 10 is attenuated, the attenuation depending on the density of the media. The media being heterogeneous, that is to say that the physical characteristics of the media, such as the density of particles composing it for example, vary from one point to another in the media. As the participating media is composed of small particles that interact with the light, the incident light, that is to say received from the light source 11 according to a direction $\omega_{in}$ 110 is not only absorbed but it is also diffused. In a participating media with isotropic diffusion, the light is diffused uniformly in all directions. In an anisotropic diffusion participating media, such as the cloud 10 shown in FIG. 1, the light diffusion depends on the angle between the direction of incidence $\omega_{in}$ 110 and the direction of diffusion $\omega_{out}$ 120 of the light. The quantity of light diffused at a point M 13 of the media 10 in the direction of diffusion $\omega_{out}$ 120 is calculated by the following equation:

$$Q(M, \omega_{out}) = D(M) \cdot \sigma_s \cdot p(M, \omega_{out}, \omega_{in}) \cdot L_{ri}(M, \omega_{in}) \quad \text{Equation 1}$$

The quantity of light diffused by a point M 13 of the media reaching the eye of a spectator 12 located in a point C of the space in the direction $\omega_{out}$ 120, i.e. the quantity of light diffused by point M and attenuated by the media 10 over the path M-P, point P being located at the intersection of the media 10 and of the direction $\omega_{out}$ in the direction of the spectator 12, then is:

$$L_P(M,\omega_{out}) = Q(M,\omega_{out}) \cdot \exp^{\int_P^M -D(s)\sigma_t ds} \quad \text{Equation 2}$$

for which:
- $\sigma_s$ is the diffusion coefficient of the media,
- $\sigma_a$ is the absorption coefficient of the media,
- $\sigma_t = \sigma_s + \sigma_a$ is the extinction coefficient of the media,
- D(M) is the density of the media at a given point, the density varying from one point to another as the media 10 is heterogeneous,
- $p(M,\omega_{out},\omega_{in})$ is the phase function describing how the light coming from the direction of incidence $\omega_{in}$ is diffused in the direction of diffusion $\omega_{out}$ at point M,
- $L_{ri}(M,\omega_{in})$ is the reduced light intensity at the point M coming from the direction of incidence $\omega_{in}$ 110 and represents the quantity of incident light arriving at the point M after attenuation due to the trajectory of the light in the media 10 on the segment K-M, K being the intersection point between the media 10 and the incidence ray $\omega_{in}$ 110, and its value is:

$$\exp^{\int_M^K -D(s)\sigma_t ds} \quad \text{Equation 3}$$

$\exp^{\int_P^M -D(s)\sigma_t ds}$ represents the diffused luminance attenuation due to the absorption and diffusion along the path from P 15 to M 13.

Equation 2 enables the quantity of light diffused by a point M and attaining the eye of a spectator 12 situated on the direction $\omega_{out}$ to be calculated. To calculate the quantity of light received by a spectator looking in direction $\omega_{out}$, it is then necessary to add up all the contributions of all the points of the media located on axis $\omega_{out}$, i.e. the points located on segment P-$M_{max}$, P and $M_{max}$ being the two points of intersection between the media 10 and the direction $\omega_{out}$ 120. This total diffused luminance arriving in P 16 from direction $\omega_{out}$ 120 due to simple diffusion then is:

$$L(P,\omega_{out}) = \int_P^{Mmax} L_P(M,\omega_{out}) dM \quad \text{Equation 4}$$

It is assumed here that the light covering the C-P path is not attenuated as the light is not attenuated outside of the medium 10.

This total diffused luminance is obtained by integrating the contributions of all the points located between P and $M_{max}$ on a radius having $\omega_{out}$ as direction. Such an integral equation cannot be resolved analytically in general and even less so for a live estimation of the quantity of light diffused. The integral is evaluated digitally using the method known as ray-marching. In this method, the integration domain is discretized into a multitude of intervals of size $\delta_M$ and the following equation is obtained:

$$L(P,\omega_{out}) \approx \Sigma_P^{Mmax} L_P(M,\omega_{out}) \delta_M \quad \text{Equation 5}$$

Advantageously, the heterogeneous participating media 10 is a three-dimensional element, shown in two dimensions on FIG. 1 for reasons of clarity.

According to a variant, the media 10 is lit by a plurality of light sources, for example 1000, 100,000 or 1,000,000 light sources.

FIGS. 2A and 2B illustrate a light environment 2 comprising several light sources 23, 24 and 25. Identical reference signs are used for identical elements on FIGS. 2A and 2B. FIG. 2A more particularly illustrates two points A 21 and B 22 illuminated by three light sources 23, 24 and 25. Point A 21 is illuminated by the first light source 23 along a direction $\omega_{1A}$ 211, by the second light source 24 along a direction $\omega_{2A}$ 212 and by the third light source 25 along a direction $\omega_{3A}$ 213.

Point B 22 is illuminated by the first light source 23 along a direction $\omega_{1B}$ 221, by the second light source 24 along a direction $\omega_{2B}$ 222 and by the third light source 25 along a direction $\omega_{3B}$ 223. The problem posed by such a complex light environment, since possessing several light sources, is that it is very expensive in terms of calculation for an estimation of the incident light in a medium, since the direction of light between a source and a point of the medium is different for each point of the medium. Indeed, the direction taken by the light emitted by the first source 23 is different for A and for B, Ia direction taken by the light emitted by the second source 24 is different for A and for B and the direction taken by the light emitted by the third source 25 is different for A and for B. To solve this problem, the estimation of the light coming from several remote light sources is made by using the environment mapping method according to a particular embodiment of the invention, such as illustrated in FIG. 2B. Rather than considering an exact direction of the light between points A and B on the one hand and light sources 23, 24, 25 on the other hand (such as illustrated on FIG. 2A), the method known as environment mapping considers that all the light sources 23, 24 and 25 of the environment 2 are located at the optical infinite with respect to points A and B. It is possible in this way to consider that the directions taken by the light emitted by a light source 23, 24 or 25 are identical irrespective of points A and B of the medium considered. The parallax effect due to the distance separating points A and B is neglected in this way. The direction $\omega_{1A}$ 211 connecting point A to the first light source 23 is considered as being identical to the direction $\omega_{1B}$ 221 connecting point B to the first light source 23. In the same manner, the direction $\omega_{2A}$ 212 connecting point A to the second light source 24 is considered as being identical to the direction $\omega_{2B}$ 222 connecting point B to the second light source 24 and the direction $\omega_{3A}$ 213 connecting point A to the third light source 25 is considered as being identical to the direction $\omega_{3B}$ 223 connecting point B to the third light source 23.

According to one variant, the light environment comprises two or more than three light sources, for example 1,000, 100,000 or 1,000,000 light sources.

FIG. 3 shows a method for estimation of the quantity of light diffused by a media 10, the light being from a light environment 3 comprising several light sources 31, 32 and 33, according to a particular embodiment of the invention. As this has been described with respect to FIG. 1, the light diffused in a point M 13 by the media 10 is a composition of the light attenuation received by the media 10 from a light source 11 (or light environment 3) and of the diffusion of this quantity of attenuated light received by the media 10. Initially, with regard to FIG. 3, the term of the equation 1 representative of the attenuation of the light received from the light environment 3 in the media 10 is estimated. To do this, a sphere $\Omega$ surrounding the point M 34 is sampled. For each direction $\omega$ from the sphere $\Omega$ of centre M, the attenuation of the light along a path comprised between M and the exterior of the media is estimated using the following equation, equivalent to equation 3:

$$R(M,\omega) = \exp^{\int_M^{K(\omega)} -D(s)\sigma_t ds} \quad \text{Equation 6}$$

where $R(M,\omega)$ is the attenuation of the light intensity at the point M 13 according to a direction $\omega$ and represents the quantity of incident light arriving at the point M after attenuation, D(s) is the density of the media, $\sigma_t$ is the extinction coefficient of the media, corresponding to the sum of the diffusion coefficient of the media $\sigma_s$ and the absorption coefficient of the media $\sigma_a$ ($\sigma_t = \sigma_s + \sigma_a$).

K 35 is the intersection point between the media 10 and the exterior of the media 10 following a direction ω leaving the point M.

Equation 6 provides the light attenuation at a point for a given direction ω. To estimate the attenuation of light at the point M according to a direction ω, the integration domain situated on the incidence direction ω is discretized into a series of intervals of size $\delta_s$, the density varying from one interval to another as the media 10 is heterogeneous. By applying the ray-marching method, a light attenuation value is obtained at point M according to the direction ω. This value is recorded in a table of a memory associated with a GPU (Graphical Processing Unit). This operation of estimation of the light attenuation at the point M 34 is reiterated for each direction ω of the sphere Ω of centre M sampled in a set comprising N directions ω going from the point M, N being any natural positive integer. These values representative of the light attenuation at the point M according to a particular direction ω are stored in the memory table associated with the GPU.

Each function of the functional space can be written as a linear combination of base functions, a base function being an element of a base for a functional space. Using an orthonormal basis of spherical functions, it is possible to represent the light attenuation function at the point M by:

$$R(M) \approx \Sigma_{j=1}^{Nc} Cr_j(M) B_j(M) \qquad \text{Equation 7}$$

where R(M) is the light attenuation function at the point M, $Cr_j(M)$ is the $j^{st}$ coefficient of projection (on a total of Nc coefficients) of the base function $B_j(M)$ and where $Cr_j(M)$ is defined by the integral on the sphere Ω, that is to say:

$$Cr_j(M) = \int_\Omega R(M,\omega) B_j(\omega) d\omega \qquad \text{Equation 8}$$

The set Nc of base function coefficients of projection thus calculated is stored in a memory table of the GPU. These coefficients are representative of the attenuation of the light emitted by a light environment comprising several sources of light, due to the simple diffusion of light from any direction for a particular given point M of the media 10.

Advantageously, the operations described above are reiterated for a set of points M of the media 10. For each point of the set of points, coefficients of projection representative of the light attenuation according to all the directions are thus calculated and recorded in the tables called attenuation records. The greater the number of points M for which the coefficients of projection are calculated the more the representation of the light attenuation due to simple diffusion in the media 10 is accurate.

Likewise, the phase function of the media 10 can be represented using an orthonormal basis of spherical functions. It is considered that the phase function of the media 10 is the same at any point of the media 10. By projecting the phase function $p(\omega_{out},\omega_{in})$ into a set Nc of coefficients of projection $Cp_j$ (called third coefficients of projection) of a base of spherical functions B, the following is obtained:

$$Cp_j(\omega_{out}) = \int_\Omega p(\omega_{out},\omega_{in}) B(\omega_{in}) d\omega_{in} \qquad \text{Equation 9}$$

This projection is carried out for a set N of directions ω going from the point M on a sphere Ω. The coefficients of projection representative of the phase function of the media are stored in a table of the memory associated with a GPU. According to a variant, the phase function varies from one point M to another and the coefficients of projection are calculated for a set of points representative of the media 10.

In an analogous manner, the function describing the environment mapping 3 representative of the incident light in the media 10 is represented using the orthonormal basis of spherical functions. By projecting the function representative of the environment mapping 3 into a set Nc of coefficients of projection $Cl_j$ (called second coefficients of projection) of a base of spherical functions B, the following is obtained:

$$Cl_j(\omega_{in}) = \int_\Omega L_i(\omega_{in}) B(\omega_{in}) d\omega_{in} \qquad \text{Equation 10}$$

where $Li(\omega_{in})$ is the function of incident light according to an incidence direction $\omega_{in}$.

Advantageously, the light attenuation function, the phase function and the incident light function are represented in a single and same orthonormal basis of spherical functions.

As has been described with regard to FIG. 1, equation 1 describes the quantity of light diffused at a point M 13 of the media 10 in the diffusion direction $\omega_{out}$ 120 for a light environment comprising a single source of light 11. Starting with this equation and adapting it for a light environment 3 comprising a plurality of light sources and described via an incident light function, the following simple diffusion equation is obtained describing the light transmitted by the media 10 at a point M according to the direction $\omega_{out}$:

$$Q(M,\omega_{out}) = \int_\Omega \sigma_s(M) \cdot p(M,\omega_{out},\omega_{in}) \cdot L_i(\omega_{in}) R(M,\omega_{in}) d\omega_{in} \qquad \text{Equation 11}$$

The functions R, $L_i$ and p were projected into a set of coefficients of projection of spherical base functions, respectively into a set of first coefficients, into a set of third coefficients and into a set of fourth coefficients. The coefficients of projection are noted respectively $\{Cr_j\}_{j=0 \ldots n}$, $\{Cl_j\}_{j=0 \ldots N}$ and $\{Cp_j\}_{j=0 \ldots N}$. The coefficients of projection describing the light attenuation function having been estimated for a set of points of the media 10 and not for all of the points of the media M, the coefficients of projection for R for the points for which they were not estimated via equation 8 are calculated by interpolation. To obtain the first coefficients of projection of the attenuation function at the point M situated on the observation direction of a spectator, an interpolation of first coefficients of projection of the function R estimated for a plurality of points (for example 4, 8 or 16 points) situated in the neighbouring area of M is carried out.

Using the first coefficients of projection representative of the attenuation of light in the media, the light coming from the light environment (estimated via equation 8 described in respect of FIG. 2 and by spatial interpolation), third coefficients of projection representative of the incident light and fourth coefficients of projection representative of the phase function of the media 10, it is possible to estimate the global attenuation of the light at a point M as it is received by a spectator 36 analytically, the resources in terms of calculating power required being very much less with respect to those required for an analytic resolution of integral form equations. To calculate the triple product of projected functions, the tensor product well known to those skilled in the art is used and using equations 2, 8 and 11 it is then possible to estimate the quantity of light emitted by a point M 13 of the media and received by a spectator 12 looking in the direction $\omega_{out}$. The following is thus obtained:

$$Q(M,\omega_{out}) \approx \Sigma_i Cp_i (\Sigma_j \Sigma_k \Gamma_{jki} Cl_j Cr_k) \qquad \text{Equation 12}$$

where $\Gamma_{jki}$ represents the tensor product, that is calculated according to:

$$\Gamma_{jki} = \int_\Omega B_j(\omega) B_k(\omega) B_i(\omega) d\omega \qquad \text{Equation 13}$$

Equation 12 represents the quantity of light emitted by a point M and received by a spectator. To obtain the total quantity of light received by a spectator situated at a point C looking in the direction $\omega_{out}$ 120, it suffices to add the sum of quantities of elementary light emitted by the set of points M, going from P to $M_{max}$. The following equation is obtained:

$$Q(C,\omega_{out}) \approx \Sigma_P^{M_{max}} L_P(M,\omega_{out}) \delta_M \qquad \text{Equation 14}$$

To obtain the total quantity of light diffused by the media 10 and received by the spectator 12, the estimations described above are reiterated for all directions leaving the user and crossing the media 10. The sum of light quantities received by the spectator according to each observation direction provides the quantity of light received from the media 10 by the spectator 12.

FIG. 4 shows a method for estimating the light attenuation at the point M according to several directions of incidence ω 421, 422, 423, 424, 425, 426 and 427, according to a particular non-restrictive embodiment of the invention. A volume 4, also called bounding box is advantageously defined around the participating media 10, that is that the volume formed by the participating media 10 is surrounded by a box of an advantageously rectangular or square parallelepipedic shape or any other shape. The bounding volume 4 can provide a rapid estimation of the volume occupied by the participating media 10 in the virtual scene. The use of a bounding volume can simplify and accelerate all the geometric calculations involving the participating media 10, the geometry of the bounding volume being simpler than that of the participating media, whose shape can be complex. The bounding volume is generated so as to include all the geometry of the participating media, a space existing between the inner surface of the bounding volume 4 and the outer surface of the participating media, at least in places. The bounding volume 4 is subdivided into a plurality of cells (for example 40×40×40 or 50×50×50 or 100×100×100 cells), each cell being advantageously defined by a point 401, 402, 403 . . . , 414, 415, 40n. The bounding volume 4 is advantageously defined by its outer surface 40 (called first surface in the rest of the description) which surrounds the bounding volume and the participating media 10. To determine the light attenuation at the point M for each direction ω, the intersections between each direction ω and the first surface 40 are estimated. The example of the direction ω 427 is used to illustrate the process for determining the light attenuation at the point M. According to this example, the point of intersection between the direction ω 427 and the first surface is the point $P_1$ 401. The point of intersection P1 with the first surface 40 is calculated by any geometric method known by those skilled in the art. As explained with regard to FIG. 3, Ia distance separating the point M from the point $P_1$ 401 is discretized into a series of intervals of size $\delta_s$. From equation 6 and by applying the ray-marching method, the value of the light attenuation (called first value of light attenuation) at the point M according to the direction ω 427 is obtained and recorded for example in a memory table associated with the GPU. This operation is reiterated for all the directions ω 421 to 427 and for all the points 401 to 40n defining the cells of the bounding volume 4, the point M corresponding to one of the points 401 to 40n. These first values can determine the light attenuation due to the simple diffusion of the light in the media 10 and thus determine the quantity of light received by the point M from the light environment 2.

According to a variant, the first surface corresponds to the outer surface of the participating media 10, which can prevent having cells located outside the participating media and consequently having a better estimation of the quantity of light received by the media 10.

To have a better estimation of the quantity of light received by the point M, the contributions of the points 401 to 40n of the media 10, different from M, in the lighting of the point M are advantageously determined. A second surface 41 is defined, which comprises points belonging to the media 10 and to the neighborhood of the point M, the quantity of light received for each of the points of the neighborhood having been determined in the same way as for the point M, that is by determining values representing the attenuation of the light emitted by the light environment along a plurality of directions ω. The points of the neighborhood of the point M forming the second surface corresponding for example to the closest points of the point M, that is the points (notably those referenced 402, 403, 414, 415) of the cells juxtaposing the cell comprising the point M. The second surface defines a second bounding volume surrounding the point M. Fore each direction ω 421 to 427 used for the estimation of the first attenuation values of the light received directly from the light environment by the point M, the points of intersection between the second surface 41 and the directions ω 421 to 427 are determined. By using the example of the direction ω 427, the intersection between the direction ω 427 and the second surface 41 corresponds to the point $P_2$ 410. The first point of intersection $P_1$ 401 and the second point of intersection $P_2$ 410 are determined by covering the direction ω 427, the direction being covered advantageously once for the determination of these two points of intersection. When the point of intersection $P_2$ 410 does not correspond to one of the points of the cells forming the bounding volume 4, that is to the points of the media for which the quantity of light received was calculated, the quantity of light received by this point $P_2$ 410 is determined by interpolation of the quantities of light received by the points 414, 415 of the media 10 belonging to the second surface 41, for example according to the distance separating the point of intersection $P_2$ 410 of each of the points of the second surface 41 for which the quantity of light received was determined and stored in memory. The discretization of the direction ω 427 used for determining the first light attenuation value at the point M (over the distance $[MP_1]$) used to determine a second light attenuation value at the point M representing the attenuation on the path $[MP_2]$, from the equation 6. In other words, the first and second light attenuation values are determined in a single pass by covering once the direction ω 427 between M and $P_1$ 401 passing through $P_2$ 410. Second light attenuation values are thus determined for each of the directions ω 421 to 427 and stored in a memory table associated with the GPU.

The total quantity of light received at the point M is calculated from the first coefficients of projection representing the first light attenuation values and second light attenuation values. To do this, the sum is made of the quantity of light received at the point M 34 by simple diffusion (that is the quantity of light received and attenuated by the media on the path comprised between the first surface and the point M 34) and the quantity of light by multiple diffusion. The multiple diffusion corresponds to the sum of the contributions of the points of the neighborhood and is obtained by adding the simple diffusions of each point of the second surface attenuated by the media 10 on the path comprised between these points and the point M 34. The total quantity of light is obtained by the following equation:

$$Q_t(M, \omega_{out}) \approx Q(M, \omega_{out}) + \sum_{i}^{N} \left( Q(P_i, \omega_{out}) e^{-\int_{M}^{P_i} \sigma_t(s) ds} \right)$$ Equation 15

Where $P_i$ corresponds to the $i^{th}$ point of neighborhood of the point M, that is to the $i^{th}$ point of the second surface.

To improve again the estimation of the quantity of light received by the point M, the contributions of the points of the media 10 belonging to one or more third surfaces bounding the second surface are advantageously determined in the same manner as described in the previous paragraph, the discretization of the different directions ω 421 to 427 only being implemented once for determining all the light attenuation values associated with the paths separating the point M from each of the intersections between the directions ω and the surfaces comprising points of the media bounding the point M.

The set of second light attenuation values (representing the attenuation of the light between the second points of intersection and the point M) forms a second function of light attenuation at the point M, the first light attenuation function at the point M being formed by the set of the first light attenuation values. Advantageously, the second light attenuation function at the point M is represented in the same orthonormal basis of spherical functions as the one used to represent the first light attenuation function, from the equation 7. A second set of Nc second coefficients of projection is determined from the equation 8, the second coefficients of projection being representative of the reduction of light intensity at the point M by projection of the second values of light intensity reduction in the orthonormal basis of spherical functions. The representation of the second function of light attenuation at the point M with second coefficients of projection can reduce the memory space required to store second reduction values of the light intensity, the number Nc of second coefficients of projection being very greatly lower than the number of second values of reductions of light intensity at the point M.

The total quantity of light $Q_t$ received at the point M is estimated from first coefficients of projection and second coefficients of projection. The simple diffusion of the media at the point M is estimated using a tensor product well known to those skilled in the art from first coefficients of projection representative of the first attenuation function of the light in the media, third coefficients of projections representing the light environment and fourth coefficients of projection representing the phase function of the media. The total quantity of light $Q_t$ received at the point M is estimated using the simple diffusion and second coefficients of projection representing the second attenuation function of the light in relation to the neighbourhood (corresponding to the multiple diffusion).

The total quantity of light received then emitted by a point M to the spectator 12 looking in the direction $\omega_{out}$, by adding the simple diffusion value and the multiple diffusion value obtained, from the following equation:

$$Q_G(M,\omega_{out}) \approx Q(M,\omega_{out}) + \Sigma_i^N(Q(P_i,\omega_{out})\Sigma C^{P_i}B(\overrightarrow{P_1M}))) \quad \text{Equation 16}$$

Where $Q(M,\omega_{out})$ corresponds to the simple diffusion at the point M 34 of the media 10, $C^{P_i}$ corresponds to the second coefficient with Pi a point of the neighborhood belonging to the second surface.

FIG. 5 diagrammatically shows a hardware embodiment of a device 5 adapted for the estimation of the quantity of light diffused by a heterogeneous participating media 10 and at the creation of display signals of one or more images. The device 5 corresponding for example to a personal computer PC, a laptop or a game console.

The device 5 comprises the following elements, connected together by an address and data bus 45 which also transports a clock signal:
- a microprocessor 51 (or CPU);
- a graphics card 52 comprising:
  - several graphics processing units 520 (or GPUs);
  - a random access memory of the GRAM ("Graphical Random Access Memory") type 521;
- a non-volatile memory of the ROM ("Read Only Memory") type 56;
- a random access memory or RAM 57;
- one or more I/O ("Input/Output") devices 54, such as for example a keyboard, a mouse, a webcam; and
- a power supply 58.

The device 5 also comprises a display device 53 of the display screen type directly connected to the graphics card 52 to display in particular the rendering of computer-generated graphics calculated and composed in the graphics card, for example in live. The use of a dedicated bus to connect the display device 53 to the graphics card 52 offers the advantage of having much higher data transmission rates and of diminishing in this way the latency time for the display of images composed by the graphics card. According to one variant, a device to display is external to the device 5 and is connected to the device 5 by a cable transmitting the display signals. The device 5, for example the graphics card 52, comprises a transmission media or connector (not represented on FIG. 5) suited to transmit a display signal to an external display means such as for example an LCD or plasma screen, a video projector.

It is noted that the word "register" used in the description of memories 52, 56 and 57 designates in each of the mentioned memories a memory zone of low capacity (some binary data) as well as a memory zone of large capacity (enabling a whole program to be stored or all or part of the data representative of data calculated or to be displayed).

When powered up, the microprocessor 51 loads and runs the instructions of the program contained in the RAM 57.

The random access memory 57 comprises in particular:
- in a register 530, the operating program of the microprocessor 51 responsible for switching on the device 5,
- parameters 571 representative of the heterogeneous participating media 10 (for example parameters of density, of light absorption coefficients, of light diffusion coefficients).

The algorithms implementing the steps of the method specific to the invention and described below are stored in the GRAM memory 57 of the graphics card 52 associated with the device 5 implementing these steps. When powered up and once the parameters 570 representative of the media are loaded into RAM 47, the graphics processing units 520 of the graphics card 52 load these parameters into GRAM 521 and execute the instructions of these algorithms in the form of microprograms of the "shader" type using the HLSL ("High Level Shader Language") language, the GLSL ("OpenGL Shading language") language for example.

The GRAM random access memory 521 comprises in particular:
- in a register 5210, the parameters representative of the media 10,
- first coefficients of projection 5211 representative of the first values of reduction of the light intensity at each point of the media 10,
- first and second values of reduction of light intensity 5212 for each point of the media 10,
- second coefficients of projection 5213 representative of the second values of reduction of the light intensity at each point of the media 10,
- third coefficients of projection 5214 representative of incident to light at each point of the media 10,
- fourth coefficients of projection 5215 representative of the phase function at each point of the media 10,
- first and second points of intersection 5216 between the directions ω and the first and second surfaces, and
- of values 5217 representative of the quantity of light diffused by the media 10 along one or more directions of observation.

According to a variant, a part of the RAM 57 is assigned by the CPU 51 for storage of the coefficients 5211, 5213, 5214 and 5215 and values 5212 and 5216 and 5217 if the memory storage space available in GRAM 521 is insufficient. This variant however brings about longer latency times in the composition of an image comprising a representation of the media 10 composed from the microprograms contained in the GPU since the data must be transmitted from the graphics card to the random access memory 57 by means of the bus 55 whose transmission capacities are generally lower than those available in the graphics card to transfer the data from the GPU to the GRAM and vice-versa.

According to another variant, the power supply 58 is external to the device 5.

FIG. 6 illustrates a method for estimating the quantity of light received at a point of a heterogeneous participating media implemented in a device 5, according to a first particularly advantageous non-restrictive implementation embodiment of the invention.

During an initialization step 60, the various parameters of the device 5 are updated. In particular, the parameters representative of the heterogeneous participating media 10 are initialised in any way.

Next, during a step 61, a first set of points of the participating media 10 is selected. This first set of points corresponds for example to the centre of cells forming a first volume bounding the participating media 10. The number of points is determined according to the quality required for the rendering of the scene comprising the media 10. The greater the number of points, the better the quality of the rendering. However, the greater the number of points, the more the calculations required to estimate the quantity of light received by these points will be larger. The number of points is for example chosen so as to have an optimum compromise between the quality of the rendering and the number of calculations required to obtain the rendering.

Then, during a second step 62, first reduction values of the light intensity are estimated for each point of the set of selected points. To do this, a plurality of first values representative of the reduction of the light intensity are calculated for the given point M 34 of the media 10 for a plurality of given directions of incidence. Each first value representative of the reduction of light intensity corresponds to a given direction of incidence among the plurality of directions of incidence and to the path of the light in the media 10 along a direction of incidence, that is on a surface comprised between the point M 34 and a first surface bounding the media 10. For each incidence direction of the plurality of incidence directions going from the light environment to join the point M 34, the value representative of the reduction in light intensity at the point M 34 is calculated using any sampling method known to those skilled in the art, advantageously using the method known as the ray-marching algorithm method. The plurality of incidence directions $\omega$ (or $\omega_{in}$) for which are calculated the first values representative of the reduction of light intensity at the point M form a sphere $\Omega$ having as centre M. The number of directions $\omega$ for which are calculated the first values representative of the reduction of light intensity at the point M is chosen in a way to find the best compromise between the calculating power required for the calculation of these values and the precision of the estimation of the reduction in light intensity at the point M desired by a user of the device 5. Choosing a number of directions $\omega$ means sampling the sphere $\Omega$ having as centre M. Advantageously, step 61 is reiterated for each point of a first set of points (for example 50, 100 or 1000 points) representative of the media 10.

Then, during a third step 63, second values of reduction of light intensity representative of the light attenuation between the point M 34 and a second surface along directions $\omega$ of light emission. The second surface comprises a part of the points of the neighbourhood of the point M 34 belonging to the first set of points selected for which first values of reduction of light intensity were estimated during the step 62. The second values of reduction of light intensity are determined in the same manner as the first values of reduction of light intensity by determining the intersections between the directions $\omega$ and the second surface. The discretization of the directions $\omega$ is common to the steps 62 and 63, only the distances between the point M 34 and respectively the intersections with the first surface and the second surface being different for the determination of the first values and second values respectively.

Then, during a fourth step 64, first coefficients of projection of a basic function in an orthonormal basis of spherical functions is estimated, these first coefficients of projection being representative of the reduction of light intensity at any point of the heterogeneous participating media 10. The first coefficients of projections advantageously result from the projection of the first values of reduction of light intensity in an orthonormal basis of spherical functions. It is understood by projection of first values in an orthonormal basis of spherical functions the representation of these first values in an orthonormal basis of spherical functions. The projection involves passing from a first basis of functions (the first values are initially represented along direction of incidence, that is according to the distance covered in the participating media along the directions of incidence before reaching the point M at which the first values are calculated) to a second basis of functions, that is the orthonormal basis of spherical functions. The coefficients of projection are the result of the representation (that is the expression) of the first values in an orthonormal basis of spherical functions. First coefficients of projection representative of the reduction of light intensity are thus obtained at each of the points of the first set of points. In other words, a set of first coefficients of projection corresponds to a point of the media and there are as many sets of first coefficients of projection calculated as there are points in the first set of points representative of the media 10. To obtain the first coefficients of projections for the points of the media for which these first coefficients have not been calculated, an interpolation of the first coefficients of projection calculated is used.

Finally, during a step 65, the quantity of light received by the point M 34 of the media 10 is estimated by using the first coefficients of projection estimated previously and the second reduction values of the light intensity, representing the contribution of the points of the neighbourhood of the point M 34 in the lighting of the point M.

Advantageously, the determination of the quantity of light received is implemented for each point of the first set of points.

According to a variant, second coefficients of projection representative of the reduction of light intensity are estimated for the point M 34 by projection of the second values of reduction of light intensity in the basis of spherical functions. These second coefficients of projections are advantageously used to determine the quantity of light received by the point M 34 in the place of the second reduction values of the light intensity having been used to represent the first function of light attenuation.

According to a variant, third coefficients of projection representative of the incident light are estimated for a set of points of the light environment 3, the points of the set being representative of the light environment. To do this, the function describing the environment mapping 3 (called incident light function) representative of incident light in the media 10 is represented using the orthonormal basis of spherical functions having served to represent the first light attenuation function. The function representative of the environment mapping 3 is thus projected into a set of third coefficients of projection of a basis of spherical functions. Advantageously, these third coefficients are stored in a table of a memory associated with one or several GPUs of the graphics card of the device 5. The third coefficients of projection are advantageously identical in any point of the media. According to a variant, the third coefficients of projection vary from one point to another or from one set of points to another belonging to the light environment.

According to another variant, fourth coefficients of projection representative of the phase function of the media 10 are estimated for a second set of points of the media 10, the points of the set being representative of the light environment. To do this, the function describing the phase function of the media 10 is represented using the orthonormal basis of spherical functions having served to represent the first light attenuation function and the incident light function. The phase function is thus projected into a set of fourth coefficients of projection of a spherical functions base. Advantageously, these fourth coefficients are stored in a table of a memory associated with one or more GPUs of the graphics card of the device 5. The fourth coefficients of projection are advantageously identical in any point of the media. According to a variant, the fourth coefficients of projection vary from one point to another or from one set of points to another belonging to the media 10.

Naturally, the invention is not limited to the embodiments previously described.

In particular, the invention is not limited to a method for estimating the quantity of light diffused by a heterogeneous participating medium but also extends to any device implementing this method and in particular all devices comprising at least one GPU. The implementation of equations described with respect to FIGS. 1 to 4 for the estimation of first, second and third coefficients of projection, of reduction of light intensity, of the quantity of light diffused is also not limited to an implementation of shader type microprograms but also extends to an implementation in any program type, for example programs that can be executed in a CPU type microprocessor.

Advantageously, the basic functions used for the estimation of the coefficients of projection are functions of the spherical harmonic type or of the spherical wavelet type.

Advantageously, the first and second coefficients of projection previously estimated are recorded and stored in one or more data structures composed of tables recorded in a memory associated with the GPUs. These recordings are called attenuation recordings. The attenuation recording tables advantageously comprise first and second coefficients of projection of the points of the media 10, whether these first and second coefficients have been calculated from the equation 8 or by interpolation from the first coefficients calculated via the equation 8. There are a set of first coefficients of projection by point of the media 10 or according to a variant for a set of points representative of the media 10. Such a storage of the first and second coefficients of projection has the advantage of accelerating the calculations for estimating the quantity of light diffused by the medium 10 and perceived by a spectator, the first coefficients of projection representative of the reduction of incident light intensity being available at any time and immediately for use in the equations 12 and 13. Likewise, the recording of the third coefficients of projection and fourth coefficients of projection in dedicated tables speed up the calculations, particularly when the third and fourth coefficients vary from one point to another (respectively from the light environment 3 and the medium 10).

The use of the invention is not limited to a live use but also extends to any other use, for example for so-called post-production processing operations in a recording studio for the rendering of computer generated pictures for example. The implementation of the invention in post-production offers the advantage of giving an excellent visual rendering in terms of realism in particular while reducing the necessary calculation times.

The invention also relates to a method for estimating the quantity of light diffused by a point of the media 10 (or by the media 10 in its entirety) in one or more given directions. The quantity of light diffused by the media 10 according to an emission direction 120 is estimated by using the quantity of light received by one or more points of the media, for example the point M 34. To do this the line segment corresponding to the intersection of the emission direction 120 with the media 120, that is to say the segment [$PM_{max}$] is spatially discretized into a multitude of points or elementary parts representative of this segment. For each point of this segment (respectively each elementary part), equation 15 or equation 16 is applied. According to a variant, the ray-marching method is implemented to estimate the reduction of light intensity between a point of the segment considered and the point P 15 situated on the periphery of the media 10 in the emission direction 120.

The invention also relates to a method for composing a video image, in two dimensions or in three dimensions, for which the quantity of light diffused by a heterogeneous participating media is calculated and the information representative of the light that results is used for the displaying of pixels of the image, each pixel corresponding to an direction of observation according to an direction of observation $\omega_{out}$. The calculated light value for displaying by each of the pixels of the image is re-calculated to adapt to the different viewpoints of the spectator.

The present invention can be used in video game applications for example, whether by programs executable in a computer of the PC or laptop type, or in specialized game consoles producing and displaying live images. The device 5 described with respect to FIG. 5 advantageously has interaction means, such as keyboard and/or joystick, other modes to enter commands such as for example voice recognition being also possible.

The invention claimed is:

1. A method for computing a quantity of light received by a point M of a heterogeneous participating medium, light being emitted by a light environment comprising a plurality of light sources, wherein the method comprises:
  selecting some of the points of said heterogeneous participating medium to form a first set of points of said heterogeneous participating medium, said first set comprising said point M,
  for each point of said first set, computing a plurality of first values of reduction of light intensity representative of light attenuation between said each point and a first surface along a plurality of particular directions of light emission, the first surface bounding the heterogeneous participating-medium,
  computing a plurality of second values of reduction of light intensity representative of light attenuation between said point M and at least one second surface along the plurality of particular directions of light emission, the at least one second surface comprising some of the points of a neighborhood of said point M belonging to the first set, for each point of said first set, computing first coefficients of projection representative of a reduction of light intensity at said point by projection of said first values of reduction of light intensity in an orthonormal basis of spherical functions, and computing the quantity of light received by said point M using said computed first coefficients of projection and the plurality of second values of reduction of light intensity.

2. The method according to claim 1, wherein the quantity of light received by said point M corresponds to a sum of the quantity of light emitted by said light environment and attenuated along the plurality of particular directions of light emission between the point M and the first surface and a quantity of light reemitted by a set of points of the at least one second surface and attenuated along the plurality of particular directions of light emission between the point M and the second surface.

3. The method according to claim 1, further comprising computing a quantity of light received by each of the points in the first set belonging to the second surface using the first coefficients of projection computed for the points of the second surface.

4. The method according to claim 1, further comprising computing intersection points between said second surface and said plurality of particular directions of light emission, a quantity of light received by an intersection point being computed by interpolation of a quantity of light received by at least two points of the second surface belonging to the first set of points when said intersection point does not belong to the first set of points.

5. The method according to claim 1, further comprising computing second coefficients of projection representative of the reduction of light intensity at the point M by projection of said second values of reduction of light intensity in said orthonormal basis of spherical functions, the quantity of light received by said point M being computed using said computed first coefficients of projection and the computed second coefficients of projection.

6. The method according to claim 1, wherein the computing of said first and second values of reduction of light intensity is carried out by ray-marching of said particular directions of light emission.

7. The method according to claim 1, further comprising computing third coefficients of projection in said orthonormal basis of spherical functions, said third coefficients of projection being representative of incident light for a set of points of said light environment.

8. The method according to claim 1, further comprising computing fourth coefficients of projection in said orthonormal basis of spherical functions, said fourth coefficients of projection being representative of a phase function for a second set of points of said heterogeneous participating medium.

9. The method according to claim 1, further comprising computing a quantity of light diffused by the point M from the quantity of light received by the point M.

10. Computer program product, comprising program code instructions for executing the method according to claim 1 when said program is executed on a computer.

11. A non-transitory computer readable medium, storing a set of instructions executable by said computer to implement the method according to claim 1.

12. The method according to claim 1, further comprising composing an image to be displayed, said image comprising at least one pixel, the computed quantity of light received by said point M being associated with said at least one pixel.

13. A device for computing a quantity of light received by a point M from a heterogeneous participating medium, light being emitted by a light environment comprising a plurality of light sources, wherein the device comprises at least a processor configured for:

selecting some of the points of said heterogeneous participating medium to form a first set of points of said heterogeneous participating medium, said first set comprising said point M, computing, for each point of said first set, a plurality of first values of reduction of light intensity representative of the light attenuation between said each point and a first surface along a plurality of particular directions of light emission, the first surface bounding the heterogeneous participating medium, computing a plurality of second values of reduction of light intensity representative of light attenuation between said point M and at least one second surface along the plurality of particular directions of light emission, the at least one second surface comprising some of the points of a neighborhood of said point M belonging to the first set, computing, for each point of said first set, first coefficients of projection representative of a reduction of light intensity at said point by projection of said first values of reduction of light intensity in an orthonormal basis of spherical functions, and computing the quantity of light received by said point M using said estimated first coefficients of projection and the plurality of second values of reduction of light intensity.

14. The device according to claim 13, wherein the at least a processor is further configured for computing second coefficients of projection representative of a reduction of light intensity at the point M by projection of said second values of reduction of light intensity in said orthonormal basis of spherical functions, the quantity of light received by said point M being computed using said computed first coefficients of projection and the computed second coefficients of projection.

15. The device according to claim 13, wherein the at least a processor is further configured for computing third coefficients of projection in said orthonormal basis of spherical functions, said third coefficients of projection being representative of incident light for a set of points of said light environment.

16. The device according to claim 13, wherein the at least a processor is further configured for computing fourth coefficients of projection in said orthonormal basis of spherical functions, said fourth coefficients of projection being representative of a phase function for a second set of points of said heterogeneous participating medium.

17. The device according to claim 13, wherein the quantity of light received by said point M corresponds to a sum of the quantity of light emitted by said light environment and attenuated along the plurality of particular directions of light emission between the point M and the first surface and a quantity of light remitted by a set of points of the at least one second surface and attenuated along the plurality of particular directions of light emission between the point M and the second surface.

18. The device according to claim 13, wherein the at least a processor is further configured to compute a quantity of light received by each of the points in the first set belonging to the second surface using the first coefficients of projection computed for the points of the second surface.

19. The device according to claim 13, wherein the at least a processor is further configured to compute intersection points between said second surface and said plurality of particular directions of light emission, a quantity of light received by an intersection point being computed by interpolation of a quantity of light received by at least two points of the second surface belonging to the first set of points when said intersection point does not belong to the first set of points.

20. The device according to claim 13, wherein the at least a processor is configured to ray-march said particular directions of light emission to computing said first and second values of reduction of light intensity.

21. The device according to claim 13, wherein the at least a processor is configured to compute a quantity of light diffused by the point M from the quantity of light received by the point M.

22. The device according to claim 13, wherein the at least a processor is further configured to compose an image to be displayed, said image comprising at least one pixel, the computed quantity of light received by said point M being associated with said at least one pixel.

* * * * *